(12) United States Patent
Sakai et al.

(10) Patent No.: US 7,479,658 B2
(45) Date of Patent: Jan. 20, 2009

(54) EPITAXIAL WAFERS, METHOD FOR MANUFACTURING OF EPITAXIAL WAFERS, METHOD OF SUPPRESSING BOWING OF THESE EPITAXIAL WAFERS AND SEMICONDUCTOR MULTILAYER STRUCTURES USING THESE EPITAXIAL WAFERS

(75) Inventors: Masahiro Sakai, Nagoya (JP); Mitsuhiro Tanaka, Handa (JP); Takashi Egawa, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 477 days.

(21) Appl. No.: 10/909,477

(22) Filed: Aug. 2, 2004

(65) Prior Publication Data
US 2005/0028888 A1    Feb. 10, 2005

(30) Foreign Application Priority Data
Aug. 4, 2003  (JP)  ............................ 2003-205728
Jun. 16, 2004 (JP)  ............................ 2004-178644

(51) Int. Cl.
*H01L 27/15*   (2006.01)
*H01L 21/00*   (2006.01)

(52) U.S. Cl. ............................ 257/79; 257/80; 257/94; 257/184; 257/E21.065; 438/22; 438/37; 438/46

(58) Field of Classification Search ................ 257/79, 257/80, 94, 96, 184, 190, E21.085; 438/22, 438/37, 30–32, 46, 47
See application file for complete search history.

(56) References Cited

U.S. PATENT DOCUMENTS

| | | | | |
|---|---|---|---|---|
| 6,828,593 B2 * | 12/2004 | Sugawara et al. | ............. | 257/94 |
| 6,956,882 B2 * | 10/2005 | Okumura | ................. | 372/45.01 |
| 2001/0002048 A1 * | 5/2001 | Koike et al. | .................. | 257/80 |
| 2001/0048114 A1 * | 12/2001 | Morita et al. | ................ | 257/103 |

FOREIGN PATENT DOCUMENTS

JP    2003-86520    3/2003

* cited by examiner

*Primary Examiner*—Hsien-Ming Lee
(74) *Attorney, Agent, or Firm*—Burr & Brown

(57) ABSTRACT

A technique for suppressing the bowing of an epitaxial wafer is provided. The epitaxial wafer is prepared by successively epitaxially growing a target group III-nitride layer, an interlayer and another group III-nitride layer on a substrate with a buffer layer. The interlayer is mainly composed of a mixed crystal of GaN and InN expressed in a general formula ($Ga_x In_y$)N ($0 \leq x \leq 1$, $0 \leq y \leq 1$, $x+y=1$) (or a crystal of GaN), and does not contain Al. The interlayer is epitaxially formed at a lower growth temperature than those of the group III-nitride layers, more specifically at a temperature in a range of at least 350° C. to not more than 1000° C.

5 Claims, 12 Drawing Sheets

FIG. 4
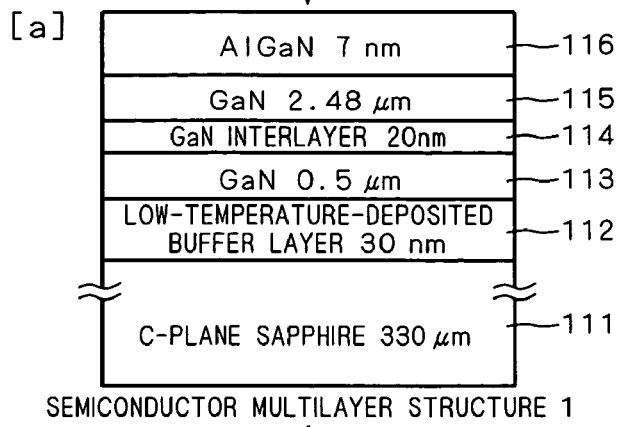
SEMICONDUCTOR MULTILAYER STRUCTURE 1
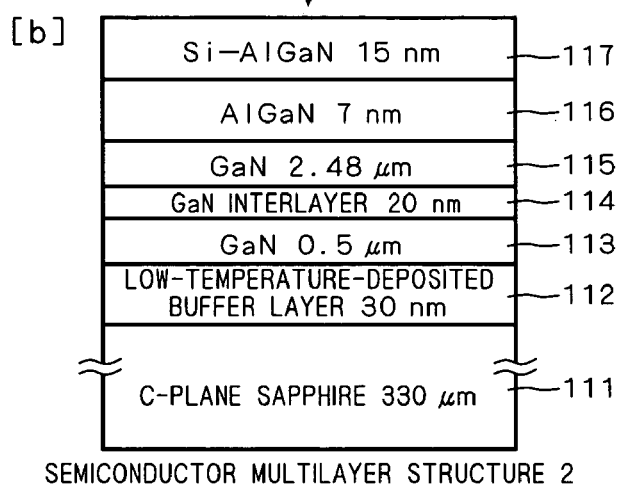
SEMICONDUCTOR MULTILAYER STRUCTURE 2
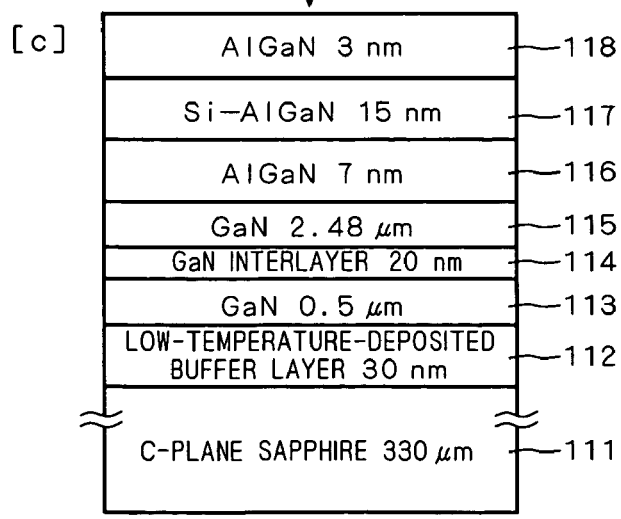
SEMICONDUCTOR MULTILAYER STRUCTURE 3

DEPENDENCE OF BOWING OF SUBSTRATE ON
TYPE AND THICKNESS OF INTERLAYER
(GROWTH TEMPERATURE OF INTERLAYER : 500°C)

DEPENDENCE OF BOWING OF SUBSTRATE ON
GROWTH TEMPERATURE FOR INTERLAYER

FIG. 12
[a]
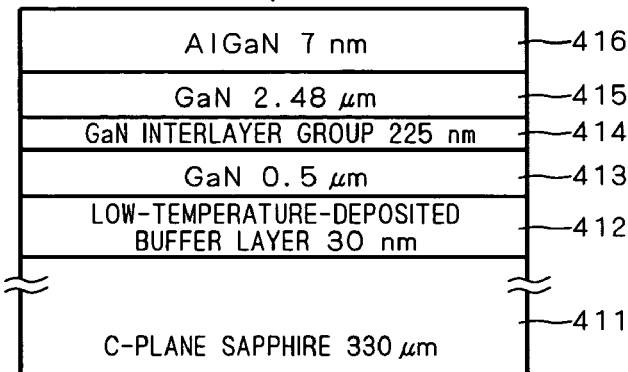
SEMICONDUCTOR MULTILAYER STRUCTURE 1
[b]
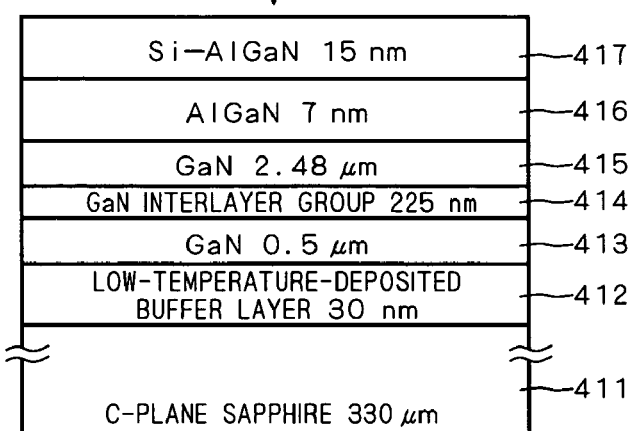
SEMICONDUCTOR MULTILAYER STRUCTURE 2
[c]
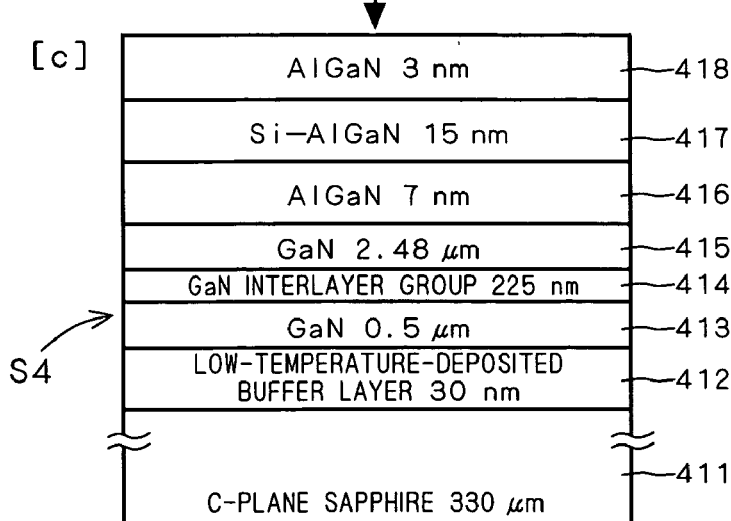
SEMICONDUCTOR MULTILAYER STRUCTURE 3

US 7,479,658 B2

EPITAXIAL WAFERS, METHOD FOR MANUFACTURING OF EPITAXIAL WAFERS, METHOD OF SUPPRESSING BOWING OF THESE EPITAXIAL WAFERS AND SEMICONDUCTOR MULTILAYER STRUCTURES USING THESE EPITAXIAL WAFERS

BACKGROUND OF THE INVENTION

1. Field of the Invention

The present invention relates to a technique for suppressing the bowing of an epitaxial wafer prepared by forming a group III-nitride multilayer film on a substrate.

2. Description of the Background Art

Group III-nitride semiconductors such as GaN-based compound semiconductors have a wide band gap, a high breakdown voltage and high saturation electron velocity compared with other semiconductors. Therefore, the group III-nitride semiconductors have frequently been studied as the material for optical devices such as light-emitting diodes, laser diodes (LDs) and photodetectors, and for electronic devices such as high-electron-mobility transistors (HEMTs) and hetero bipolar transistors (HBTs).

It is difficult to grow large-size bulk single-crystal GaN-based compound semiconductors. Therefore, sapphire or SiC substrates commonly are used for the growth of the GaN-based material by metal-organic chemical vapor deposition (MOCVD). However, a mismatch of the lattice constants between the GaN-based compound semiconductor and the substrates is so large that a high-quality epitaxial layer can not be obtained by directly forming the target GaN-based compound semiconductor on the substrate. Therefore, a technique for forming a buffer layer of AlN or GaN has been widely employed. The buffer layers are formed on the substrate in advance of formation of the epitaxial layer of the GaN-based compound semiconductor. For example, Japanese Patent Application Laid-Open Gazette No. 8-8217 (1998) discloses a technique of forming a buffer layer consisting of $Al_{X1}Ga_{1-X1}N$ ($1 \leq X1 \leq 1$) prepared at a temperature growing no high-quality single crystal between a target epitaxial layer and a substrate.

FIG. 14 is a schematic view of an epitaxial wafer prepared by using this technique of forming a buffer layer. As understood from FIG. 14, an epitaxial wafer 5 is prepared by epitaxially growing a target group III-nitride layer 53 on a prescribed substrate 51 with a buffer layer 52. For example, an $(Al_xGa_y)N$ ($0 \leq x \leq 1$, $0 \leq y \leq 1$, $x+y=1$) layer (low-temperature-deposited buffer layer having low crystallinity) of 20 nm to 50 nm in thickness formed by MOCVD at a temperature of 400° C. to 600° C. or an AlN layer (high-temperature-grown buffer layer having high crystallinity) of about 1 μm in thickness formed by MOCVD at a temperature of at least 1000° C. or more can be applied for the buffer layer 52. A target group III-nitride layer 53 is epitaxially formed on the buffer layer 52 by MOCVD at a temperature of 1000° C. to 1300° C. Thus, a high-quality epitaxial single crystalline layer can be formed on a substrate by forming a target group III-nitride layer with a buffer layer.

According to the conventional art, however, the epitaxial wafer provided with the group III-nitride layer on its surface may experience bowing due to the difference of the thermal expansion coefficients of between the group III-nitride layer and the substrate. This bowing disturbs the vacuum chuck properties during transfer steps or reduces the exposure accuracy in a photolithography step. Further, this bowing may cause cracking on the epitaxial wafer. Therefore, a technique for suppressing the bowing of the epitaxial wafer is strongly demanded.

SUMMARY OF THE INVENTION

The present invention relates to a technique for suppressing the bowing of an epitaxial wafer obtained by forming a group III-nitride multilayer film on a substrate.

An epitaxial wafer according to a first aspect of the present invention comprises a substrate, at least two group III-nitride layers epitaxially formed on the substrate and at least one group III-nitride interlayer, epitaxially formed between at least two group III-nitride layers, substantially containing no Al. The growth temperature for the group III-nitride interlayer is lower than the growth temperature for each of at least two group III-nitride layers. Thus, bowing of the epitaxial wafer can be suppressed. When this epitaxial wafer is used, the chance of the vacuum chuck failing during a transfer step decreases and the exposure accuracy etc. in a photolithography step can be improved. Further, the epitaxial wafer can be prevented from cracking.

An epitaxial wafer according to a second aspect of the present invention comprises a substrate, at least two group III-nitride layers epitaxially formed on the substrate and at least one group III-nitride interlayer, epitaxially formed between at least two group III-nitride layers, substantially containing no Al, wherein the group III-nitride interlayer functions as a stress relaxation layer. When this epitaxial wafer is used, the chance of the vacuum chuck failure during a transfer step decreases and the exposure accuracy in a photolithography step can be improved. Further, the epitaxial wafer can be prevented from cracking.

An epitaxial wafer according to a third aspect of the present invention comprises a substrate, at least two group III-nitride layers epitaxially formed on the substrate and at least one group III-nitride interlayer group, epitaxially formed between at least two group III-nitride layers, substantially containing no Al and including at least one first interlayer formed at a first forming temperature and a plurality of second interlayers alternately stacked with at least one first interlayer and formed at a second growth temperature lower than the first growth temperature. The second growth temperature is also lower than the growth temperature for each of at least two group III-nitride layers. Thus, bowing of the epitaxial wafer can be suppressed. When this epitaxial wafer is used, the chance of the vacuum chuck failing during a transfer step decreases and the exposure accuracy in a photolithography step can be improved. Further, the epitaxial wafer can be prevented from cracking.

An epitaxial wafer according to a fourth aspect of the present invention comprises a substrate, at least two group III-nitride layers epitaxially formed on the substrate and at least one group III-nitride interlayer group, epitaxially formed between at least two group III-nitride layers, substantially containing no Al and including at least one first interlayer and a plurality of second interlayers formed at a growth temperature different from that of the first interlayer and alternately stacked with at least one first interlayer, wherein the group III-nitride interlayer group functions as a stress relaxation layer. Thus, bowing of the epitaxial wafer can be suppressed. When this epitaxial wafer is used, the chance of the vacuum chuck failing during a transfer step decreases and the exposure accuracy in a photolithography step can be improved. Further, the epitaxial wafer can be prevented from cracking.

The present invention is also directed to a method for manufacturing of an epitaxial wafer and a semiconductor multilayer structure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates a method of forming a semiconductor multilayer structure according to Example 1.

FIG. 12 illustrates a method of forming a semiconductor multilayer structure according to Example 7.

DETAILED DESCRIPTION OF THE INVENTION

Multilayer Structure of Epitaxial Wafer

Figure 1:
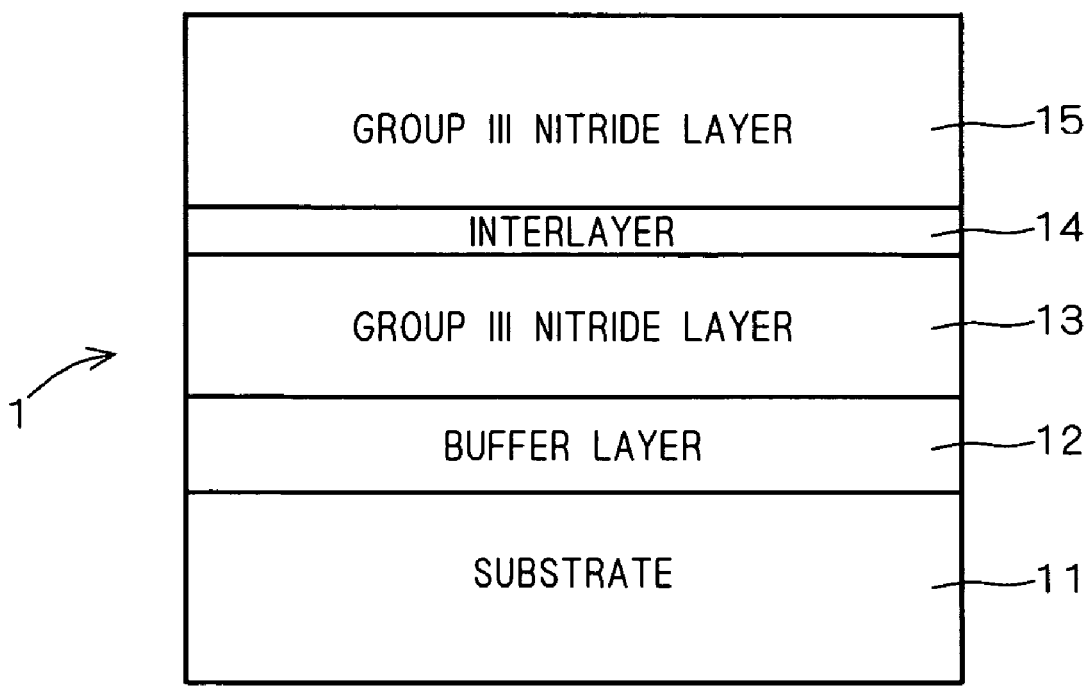
FIG. 1 is a schematic view of an epitaxial wafer 1 according to an embodiment of the present invention.

A multilayer structure of an epitaxial wafer 1 according to an embodiment of the present invention is described with reference to the schematic view shown in FIG. 1.

The epitaxial wafer 1 has a multilayer structure obtained by inserting an interlayer functioning as a stress relaxation layer in the group III-nitride layer 53 of the epitaxial wafer 5 according to the conventional art. More specifically, the epitaxial wafer 1 is prepared by successively epitaxially growing a group III-nitride layer 13, an intermediate layer 14 and another group III-nitride layer 15 on a substrate 11 with a buffer layer 12.

The material for the substrate 11 is not particularly restricted, and can be properly selected from single crystals of sapphire, ZnO, $LiAlO_2$, $LiGaO_2$, $MgAl_2O_4$, $(LaSr)(AlTa)O_3$, $NdGaO_3$, MgO, Si, SiC, GaAs, AlN, GaN, AlGaN, $ZrB_2$ and the like, for example. The thickness of the substrate 11, which is not particularly restricted either, is preferably set to 220 μm to 1000 μm, for example.

The buffer layer 12 is epitaxially grown on the substrate 11 for relaxing lattice mismatching between the substrate 11 and the group III-nitride layer 13. For example, an $(Al_xGa_yIn_z)N$ ($0 \leq x \leq 1$, $0 \leq y \leq 1$, $0 \leq z \leq 1$, $x+y+z=1$) layer (low-temperature-deposited buffer layer having low crystallinity) of 5 nm to 50 nm in thickness formed by MOCVD at a temperature of 400° C. to 1000° C. or an $(Al_xGa_yIn_z)N$ ($0<x \leq 1$, $0 \leq y<1$, $0 \leq z<1$, $x+y+z=1$) layer (high-temperature-grown buffer layer having high crystallinity) of about 20 nm to 3.0 μm in thickness formed by MOCVD at a temperature of at least 1000° C. or more can be applied for the buffer layer 12. The group III-nitride layer 13 is epitaxially formed on the buffer layer 12 by MOCVD at a temperature of 1000° C. to 1300° C. The group III-nitride layer 13 consists of a mixed crystal of AlN, GaN and InN expressed in a general formula $(Al_xGa_yIn_z)N$ ($0 \leq x \leq 1$, $0 \leq y \leq 1$, $0 \leq z \leq 1$, $x+y+z=1$) (or a crystal of GaN), and preferably contains at least 50% of GaN ($y \geq 0.5$), more preferably at least 80% of GaN ($y \geq 0.8$). This group III-nitride layer 13 may contain a donor or an acceptor such as Mg, Be, Zn, Si or Ge, to be provided with p-type or n-type semiconductor conductivity.

The interlayer 14 formed on the group III-nitride layer 13 is mainly composed of a mixed crystal of GaN and InN expressed in a general formula $(Ga_xIn_y)N$ ($0 \leq x \leq 1$, $0 \leq y \leq 1$, $x+y=1$) (or a crystal of GaN), and does not contain Al. While the group III-nitride layer 15 is formed on the interlayer 14 by a method that is similar to that used for the group III-nitride layer 13, the interlayer 14 is epitaxially formed at a lower growth temperature compared with those of the group III-nitride layers 13 and 15. Concretely, the growth temperature for the interlayer 14 is less than 1000° C. The interlayer 14, which may or may not be single crystal, is epitaxially grown at a growth temperature that is lower than those for the group III-nitride layers 13 and 15 to have a reduced crystallinity compared to the group III-nitride layers 13 and 15 due to the introduction of defects. The interlayer 14 having low crystallinity is inserted between the group III-nitride layers 13 and 15 so as to relax thermal stress caused on the epitaxial wafer 1 due to the difference of the thermal expansion coefficients between the substrate 11 and the group III-nitride layers 13 and 15, whereby bowing of the epitaxial wafer 1 can consequently be suppressed. If the crystallinity of the interlayer 14 is excessively reduced, however, the quality of the group III-nitride layer 15 is badly influenced. Therefore, the growth temperature of the interlayer 14 is preferably at least 350° C. The thickness of the interlayer 14 is preferably in the range of at least 10 nm and not more than 70 nm, particularly in the range of at least 15 nm and not more than 50 nm.

As described later, the interlayer 14 may be a single layer, or may include a plurality of layers. Further, each of the group III-nitride layers 13 and 15 may also be a single layer or may include a plurality of layers. Various semiconductor multilayer structures can be formed on the epitaxial wafer 1 prepared in the aforementioned manner, as described later in more detail with reference to the Examples.

Manufacturing Apparatus

Figure 2:
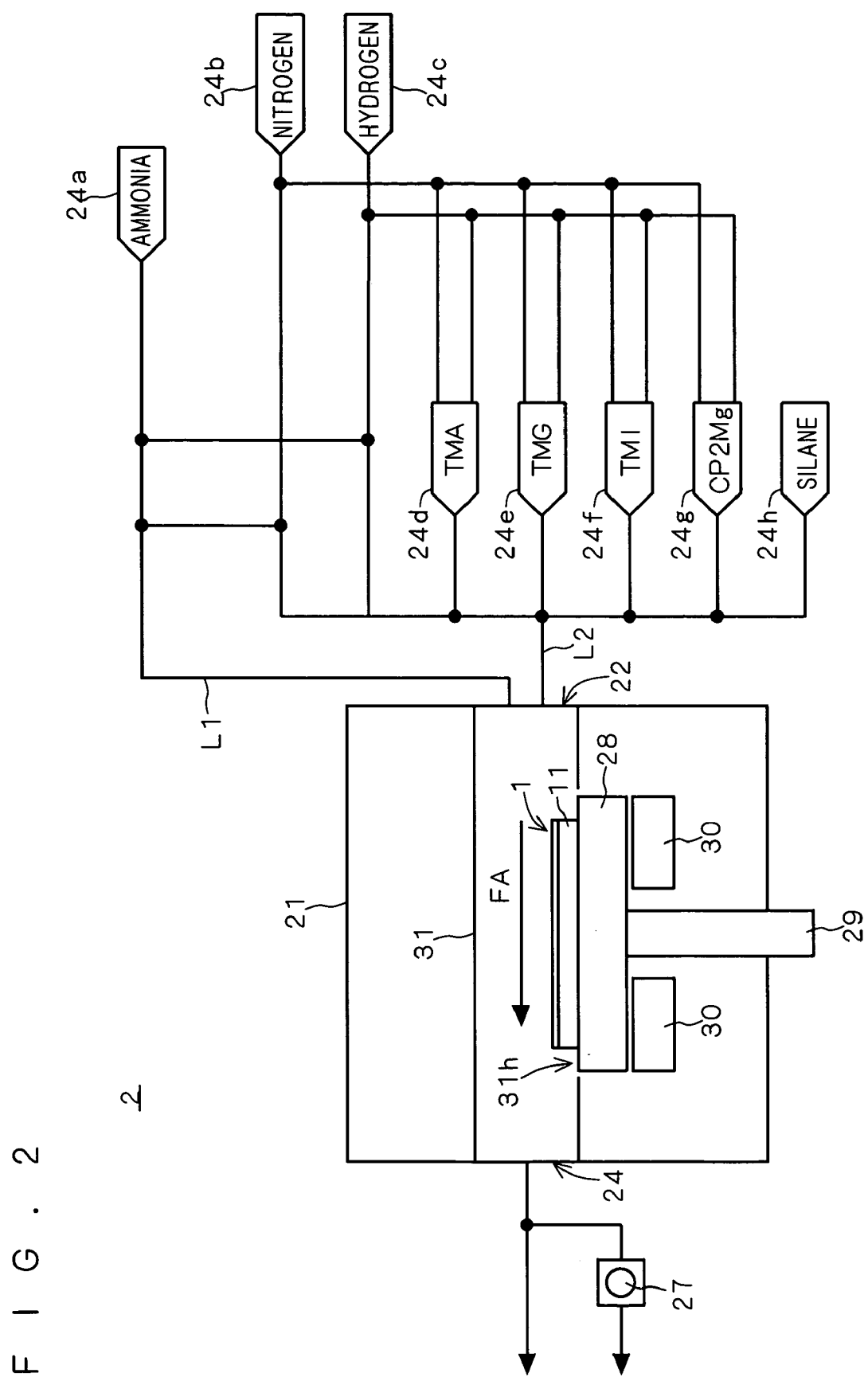
FIG. 2 is a schematic view of a manufacturing apparatus 2 for the epitaxial wafer 1 according to the embodiment.

A manufacturing apparatus 2 for the epitaxial wafer 1 according to this embodiment is a so-called "MOCVD apparatus." The manufacturing apparatus 2 is constituted to be capable of feeding a source gas for forming epitaxial layers onto the main surface of the substrate 11. The manufacturing apparatus 2 is now described with reference to the sectional view shown in FIG. 2.

The manufacturing apparatus 2 comprises a flow channel 31 for introducing a reactive gas into the main surface of the substrate 11. The flow channel for a reactive gas set in an airtight reaction vessel 21 has two outer ends forming an inlet 22 and an outlet 24 for the reactive gas, respectively. The flow channel for reactive gas 31 is further provided with an opening 31*h* for bringing the reactive gas into contact with the main surface of the substrate 11.

Pipelines L1 and L2 are connected to the outlet 22 provided outside the reaction vessel 21. The pipeline L1 is employed for supplying ammonia gas ($NH_3$), nitrogen gas ($N_2$) and hydrogen gas ($H_2$).

On the other hand, the pipeline L2 is employed for supplying TMA (trimethylaluminum: $Al(CH_3)_3$), TMG (trimethylgarium: $Ga(CH_3)_3$), TMI (trimethylindium: $In(CH_3)_3$), $CP_2Mg$ (cyclopentadienyl magnesium: $Mg(C_5H_5)_2$, silane gas ($SiH_4$), nitrogen gas and hydrogen gas. Supply sources 24*d* to 24*g* for TMA, TMG, TMI and $CP_2Mg$ are connected to the pipeline L2.

The supply sources 24*d* to 24*g* for TMA, TMG, TMI and $CP_2Mg$ are connected to a nitrogen gas supply source 24*b* for bubbling. The supply sources 24*d* to 24*g* for TMA, TMG, TMI and $CP_2Mg$ are also connected to a hydrogen gas supply source 24*c*.

In the manufacturing apparatus 2, hydrogen ($H_2$), nitrogen ($N_2$) or a gas mixture thereof functions as carrier gas. The gas flow rates of all gas supply systems are controlled through a flowmeter.

A vacuum pump 27 is connected to the outlet 24 for forcibly discharging gas from the reaction vessel 21.

The reaction vessel 21 is provided therein with a base table 28 for receiving the base 11 to be formed with epitaxial layers and a support shaft 29 supporting the base table 28 in the reaction table 21. The temperature of the base table 28 can be controlled through a heater 30. In the manufacturing apparatus 2, the temperature of the base table 28 in close contact with the substrate 11 is varied thereby varying the growth temperatures for the epitaxial layers. In other words, the growth temperatures for the epitaxial layers formed according to MOCVD can be variably controlled through the heater 30.

EXAMPLES

Specific procedures for manufacturing epitaxial wafers according to inventive Examples 1 to 6 and Comparative Examples 1 and 2 using MOCVD are now described. Methods for forming semiconductor multilayer structures on these epitaxial wafers are also described with reference to Examples 1 to 6 and Comparative Examples 1 and 2.

Example 1

Figure 3:
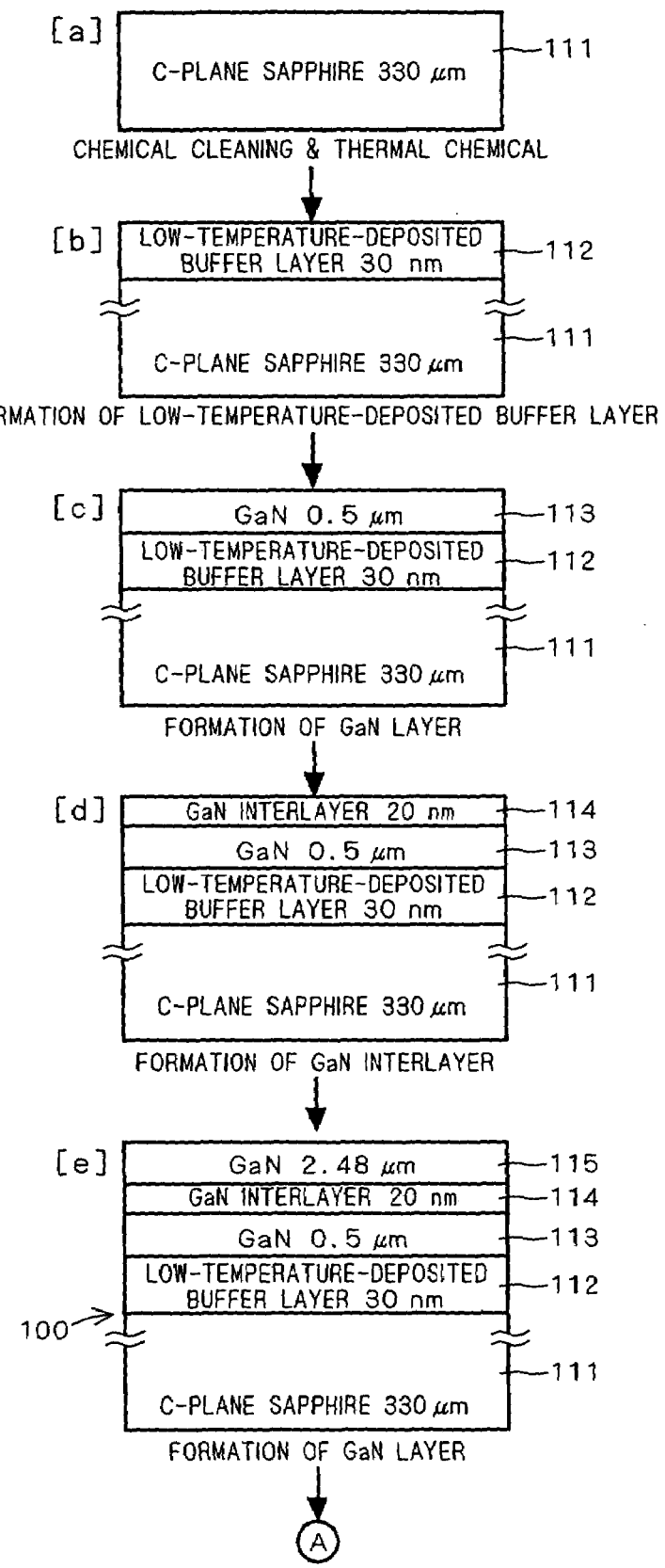
FIG. 3 illustrates a method for manufacturing of an epitaxial wafer 100 according to Example 1.

A method for manufacturing an epitaxial wafer 100 including a GaN interlayer, which is grown at 500° C. and does not substantially contain Al according to Example 1 is described with reference to the process flow chart shown in FIG. 3, and a method for forming a semiconductor multilayer structure on this epitaxial wafer 100 is described with reference to the process flow chart shown in FIG. 4. The process flow charts shown in FIGS. 3 and 4 are model diagrams conceptually illustrating the states of the epitaxial wafer 100 in respective steps, and hence, the thicknesses of layers illustrated in these figures do not necessarily reflect the thickness ratios in the practical epitaxial wafer 100. This also applies to subsequent process flow charts.

According to Example 1, a substantially circular C-plane single-crystal two-inch-diameter 330-µm-thick sapphire substrate was employed as a substrate 111. In advance of formation of epitaxial layers on the main surface of the substrate 111, the substrate 111 was cleaned with a mixed solution of sulfuric acid ($H_2SO_4$) and hydrogen peroxide water ($H_2O_2$). Then, the substrate 111 was placed on the base table 28 provided in the reaction vessel 21 and subjected to thermal cleaning. This thermal cleaning was performed by heating the base 111 to 1200° C. with the heater 30 while hydrogen gas was fed into the flow channel for reactive gas 31 under atmospheric pressure at a mean velocity of 2 m/sec., and the state of 1200° C. was held for 10 minutes ([a] in FIG. 3).

After termination of the thermal cleaning, the temperature of the base 111 was reduced to 500° C., for introducing a gas mixture of TMG and ammonia gas into the flow channel for reactive gas 31 so that the mean velocity was 2 m/sec. Thus, a low-temperature-deposited buffer layer 112 of GaN having a thickness of 30 nm was epitaxially formed on the substrate 111 ([b] in FIG. 3).

Then, the substrate 111 was heated to 1180° C. for introducing a gas mixture of TMG and ammonia gas into the flow channel for reactive gas 31 so that the mean velocity was 4 m/sec. Thus, a GaN layer 113 having a thickness of 0.5 µm was epitaxially formed on the low-temperature-deposited buffer layer 112 ([c] in FIG. 3). Then, the temperature of the base 111 was reduced to 500° C., for introducing a gas mixture of TMG and ammonia gas from the reactive gas supply pipe 22 into the reaction vessel 21 so that the mean velocity was 2 m/sec. Thus, a GaN interlayer 114 having a thickness of 20 nm and having lower crystallinity than the GaN layer 113 was epitaxially formed on the GaN layer 113 ([d] in FIG. 3). Further, the base 111 was again heated to 1180° C., for introducing a gas mixture of TMG and ammonia gas into the flow channel for reactive gas 31 so that the mean velocity was 4 m/sec. Thus, a GaN layer 115 having a thickness of 2.48 µm was epitaxially formed on the GaN interlayer 114 ([e] in FIG. 3). It follows that the GaN interlayer 114 having low crystallinity was formed between the GaN layers 113 and 115 through the steps [c] to [e] in FIG. 3.

Steps for forming a semiconductor multilayer structure on the epitaxial wafer 100 prepared through the aforementioned steps are now described.

First, a gas mixture of TMA, TMG and ammonia gas was introduced into the flow channel for reactive gas 31 for forming an epitaxial layer 116 of 7 nm in thickness having a composition of $Al_{0.25}Ga_{0.75}N$ ([a] in FIG. 4). Then, a gas mixture of silane gas, TMA, TMG and ammonia gas was introduced into the flow channel for reactive gas 31 for forming an epitaxial layer 117 having a thickness of 15 nm and having a basic composition of $Al_{0.25}Ga_{0.75}N$ doped with Si ([b] in FIG. 4). The epitaxial layer 117 was an n-type semiconductor layer due to the Si serving as a donor. Further, a gas mixture of TMA, TMG and ammonia gas was introduced into the flow channel for reactive gas 31, for forming another epitaxial layer 118 having a thickness of 3 nm and having a composition of $Al_{0.25}Ga_{0.75}N$ ([c] in FIG. 4).

Figure 5:
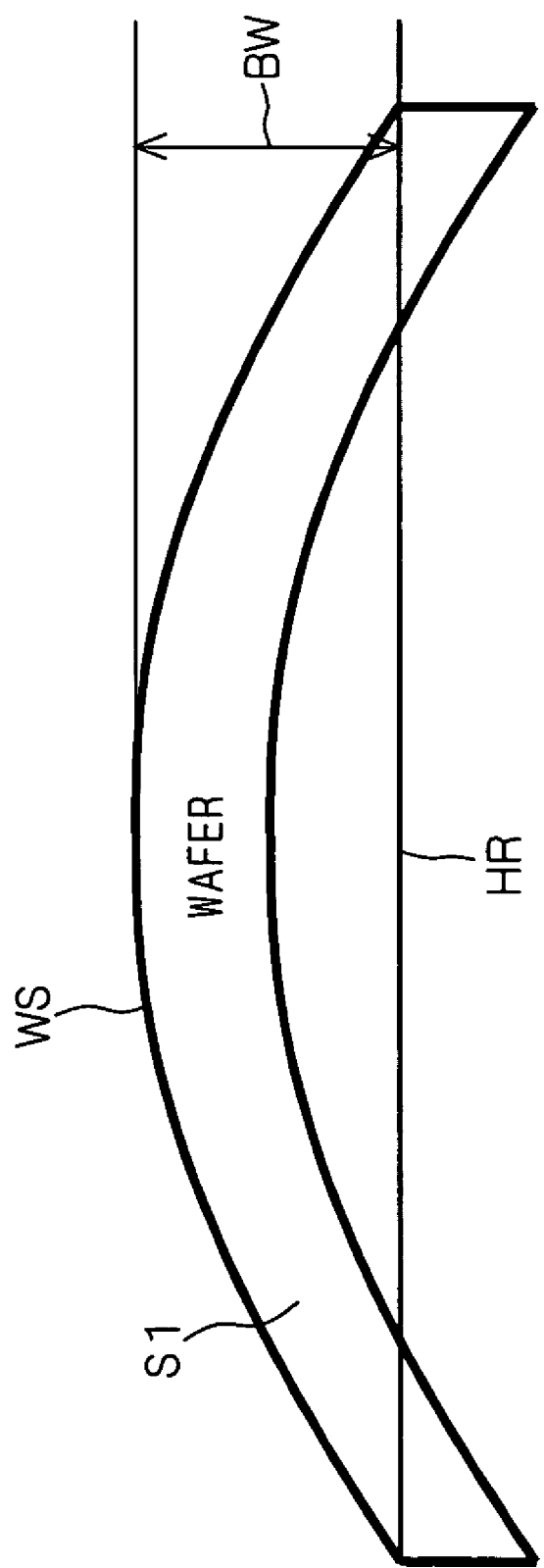
FIG. 5 illustrates a method of defining a bowing value BW of a sample S1.

A sample S1 prepared in the aforementioned manner was removed from the reaction vessel 21 and the bowing value BW was measured to be 15 µm. As shown in FIG. 5, the bowing value BW was defined by the maximum lift quantity on a wafer surface, i.e., the distance of projection of a wafer surface WS from a horizontal position HR.

Comparative Example 1

A method for manufacturing of an epitaxial wafer 200 including an AlN interlayer grown at 500° C. according to Comparative Example 1 is described with reference to the process flow chart shown in FIG. 6, and a method of forming a semiconductor multilayer structure on this epitaxial wafer 200 is described with reference to the process flow chart shown in FIG. 7. The process flow according to Comparative Example 1 was identical to that according to Example 1, except that an AlN interlayer was formed through a step [d] in FIG. 6.

Figure 6:
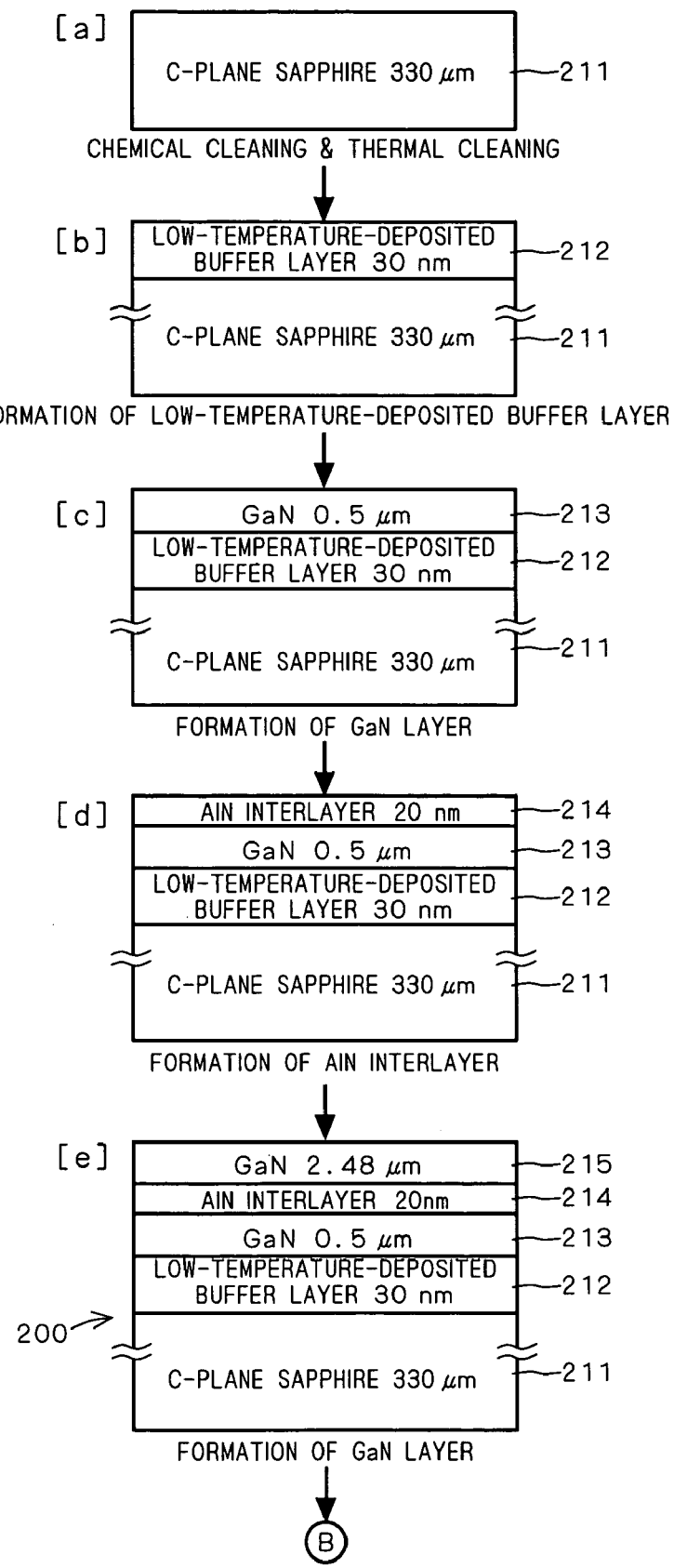
FIG. 6 illustrates a method for manufacturing of an epitaxial wafer 200 according to Comparative Example 1.
Figure 7:
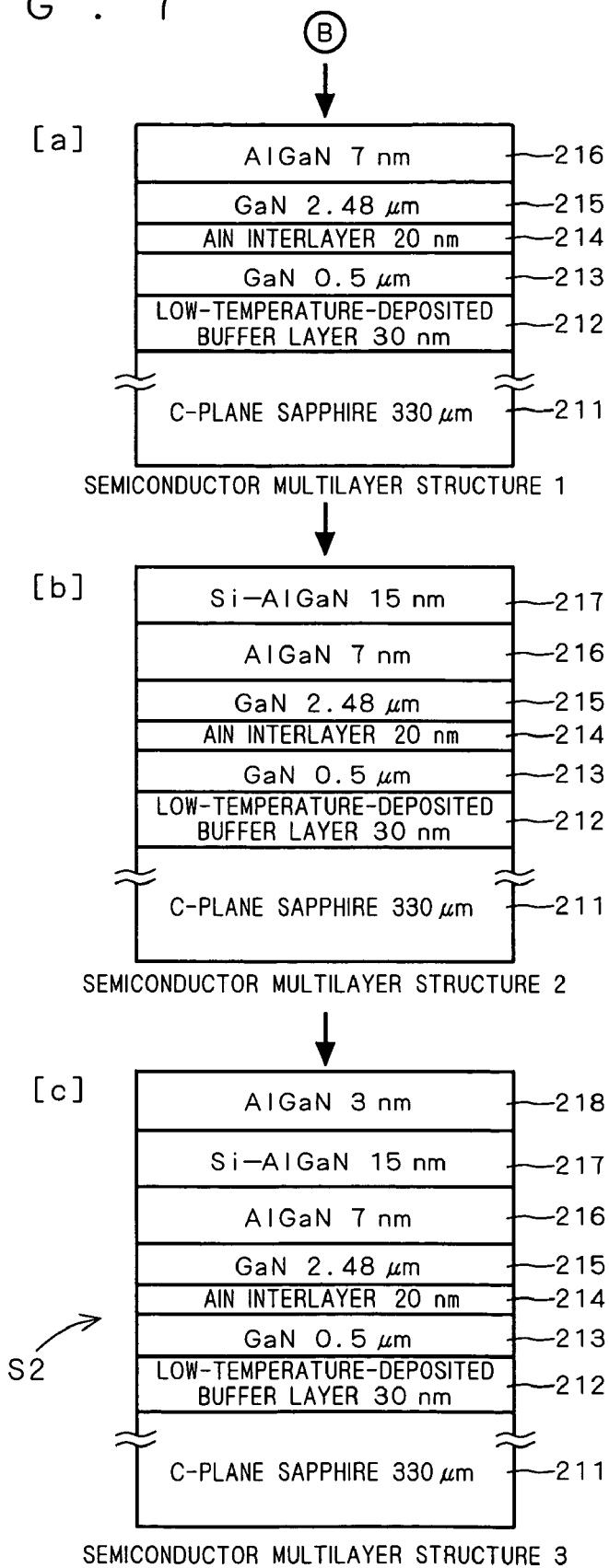
FIG. 7 illustrates a method of forming a semiconductor multilayer structure according to Comparative Example 1.

First, a low-temperature-deposited buffer layer 212 of GaN having a thickness of 30 nm and a GaN layer 213 having a thickness of 0.5 μm were epitaxially formed on a base 211 that was similar to that used in Example 1, under the same conditions as those in Example 1 ([b] and [c] in FIG. 6). Then, the temperature of the base 211 was reduced to 500° C. for introducing a gas mixture of TMA and ammonia gas into the flow channel for reactive gas 31 so that the mean velocity was 2 m/sec. Thus, an AlN interlayer 214 having a thickness of 20 nm and having lower crystallinity than the GaN layer 213 was epitaxially formed on the GaN layer 213 ([d] in FIG. 6). Further, an epitaxial layer 215 having a thickness of 2.48 μm, another epitaxial layer 216 having a thickness of 7 nm and having a composition of $Al_{0.25}Ga_{0.75}N$, still another epitaxial layer 217 having a thickness of 15 nm and having a basic composition of $Al_{0.25}Ga_{0.75}N$ doped with Si, and a further epitaxial layer 218 having a thickness of 3 nm and having a composition of $Al_{0.25}Ga_{0.75}N$ were formed under the same conditions as those in Example 1 ([d] in FIG. 6 to [c] in FIG. 7).

A sample S2 prepared in the aforementioned manner was removed from the reaction vessel 21 and the bowing value BW was measured to be 39 μm using the same measuring method as that in Example 1.

Comparative Example 2

A method for manufacturing of an epitaxial wafer 300 without an interlayer formed at a reduced growth temperature according to Comparative Example 2 and a method for forming a semiconductor multilayer structure on this epitaxial wafer 300 are now described with reference to the process flow chart shown in FIG. 8.

Figure 8:
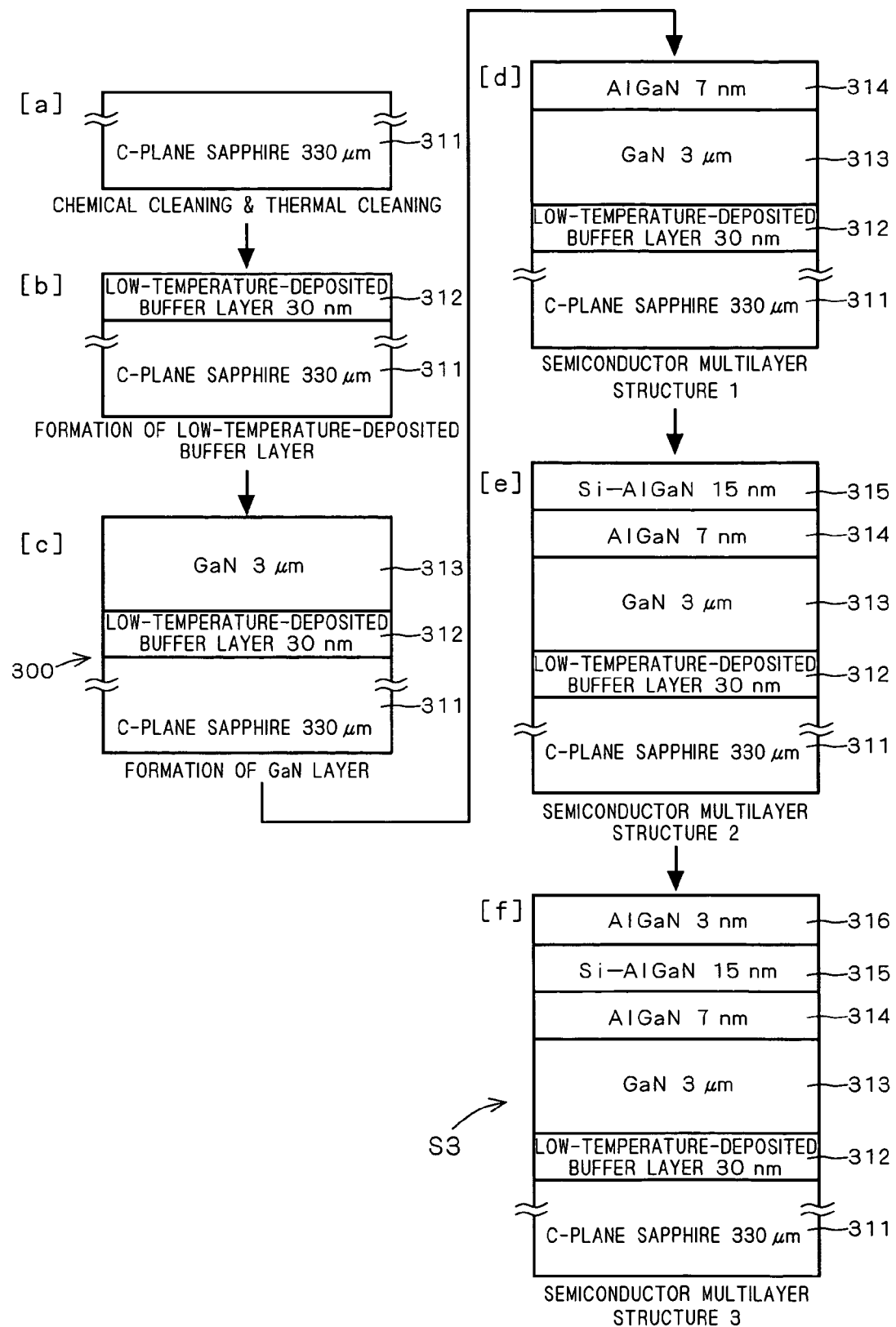
FIG. 8 illustrates a method for manufacturing of an epitaxial wafer 300 and a method of forming a semiconductor multilayer structure according to Comparative Example 2.

A low-temperature-deposited buffer layer 312 of GaN having a thickness of 30 nm was epitaxially formed on a substrate 311 similar to that employed in Example 1 under the same conditions as those in Example 1 ([b] in FIG. 8). Then, the base 311 was heated to 1180° C., for introducing a gas mixture of TMG and ammonia gas into the flow channel for reactive gas 31 so that the mean velocity was 4 m/sec. Thus, a GaN layer 314 having a thickness of 3 μm was epitaxially formed on the low-temperature-deposited buffer layer 312 ([c] in FIG. 8). Further, an epitaxial layer 314 having a thickness of 7 nm and having a composition of $Al_{0.25}Ga_{0.75}N$, another epitaxial layer 315 having a thickness of 15 nm and having a basic composition of $Al_{0.25}Ga_{0.75}N$ doped with Si, and still another epitaxial layer 316 having a thickness of 3 nm and having a composition of $Al_{0.25}Ga_{0.75}N$ were formed under the same conditions as those in Example 1 ([d] to [f] in FIG. 8).

A sample S3 prepared in the aforementioned manner was removed from the reaction vessel 21 and the bowing value BW was measured to be 30 μm using the same measuring method as that in Example 1.

Examples 2 to 5

Epitaxial wafers according to Examples 2, 3 and 4 correspond to those obtained by changing the thicknesses of GaN interlayers similar to that of the epitaxial wafer 100 according to Example 1 from 20 nm to 5 nm, 50 nm and 100 nm, respectively. The epitaxial wafer according to Example 5 was obtained by changing the epitaxial formation temperature of a GaN interlayer similar to that of the epitaxial wafer 100 according to Example 1 from 500° C. to 800° C.

Figure 9:
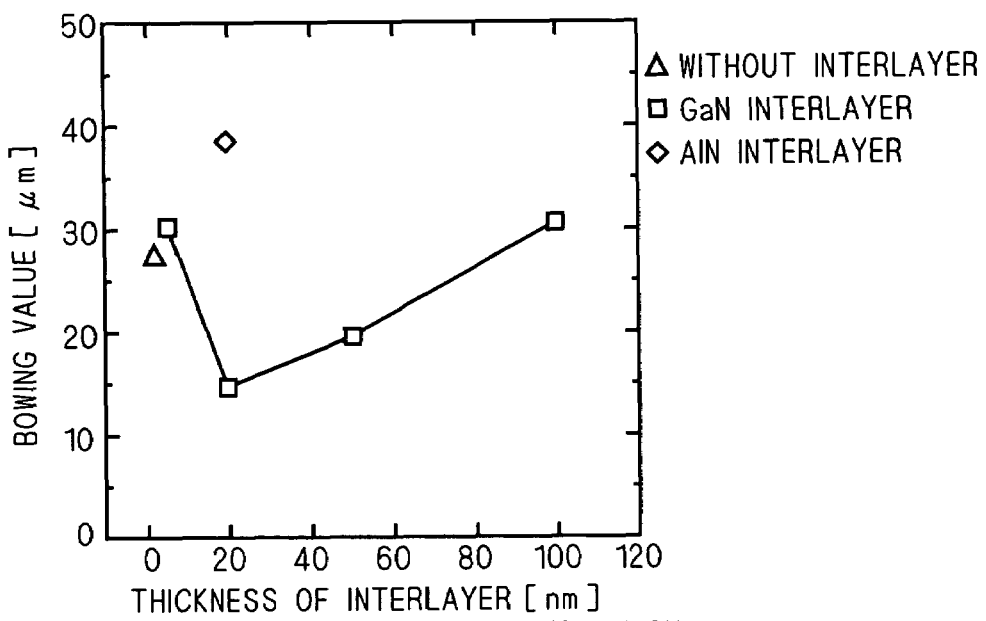
FIG. 9 shows dependence of a bowing value BW on the thickness of an interlayer every type of interlayer.
Figure 10:
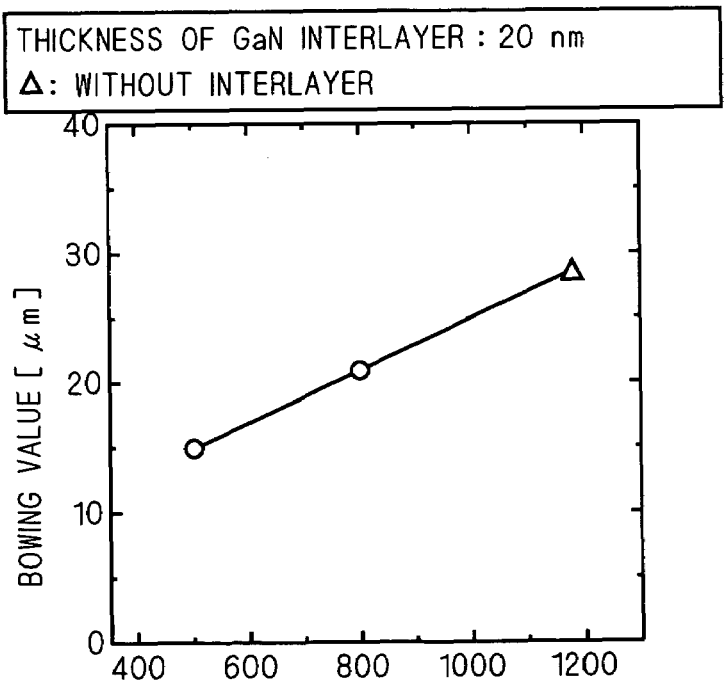
FIG. 10 shows dependence of the bowing value BW on the growth temperature of the interlayer.

FIG. 9 shows the dependence of the bowing value BW on the thicknesses of the GaN interlayers for the respective types (GaN and AlN) of interlayers according to Examples 1 to 4 and Comparative Example 1 having interlayers that are grown at a temperature of 500° C., and a sample according to Comparative Example 2 without an interlayer. FIG. 10 shows the dependence of the bowing values BW on the growth temperatures for the GaN interlayers of Examples 1 to 5 with GaN interlayers having a thickness of 20 nm and the sample according to Comparative Example 2 without an interlayer.

Example 6

While a single GaN interlayer was formed as a stress relaxation layer in each of Examples 1 to 5, the stress relaxation layer may alternatively be formed by an interlayer group including a plurality of layers. A method for manufacturing of an epitaxial wafer 400 having an interlayer group including a plurality of layers according to Example 6 is described with reference to the process flow chart shown in FIG. 11, and a method of forming a semiconductor multilayer structure on this epitaxial wafer 400 is described with reference to the process flow chart shown in FIG. 12.

Figure 11:
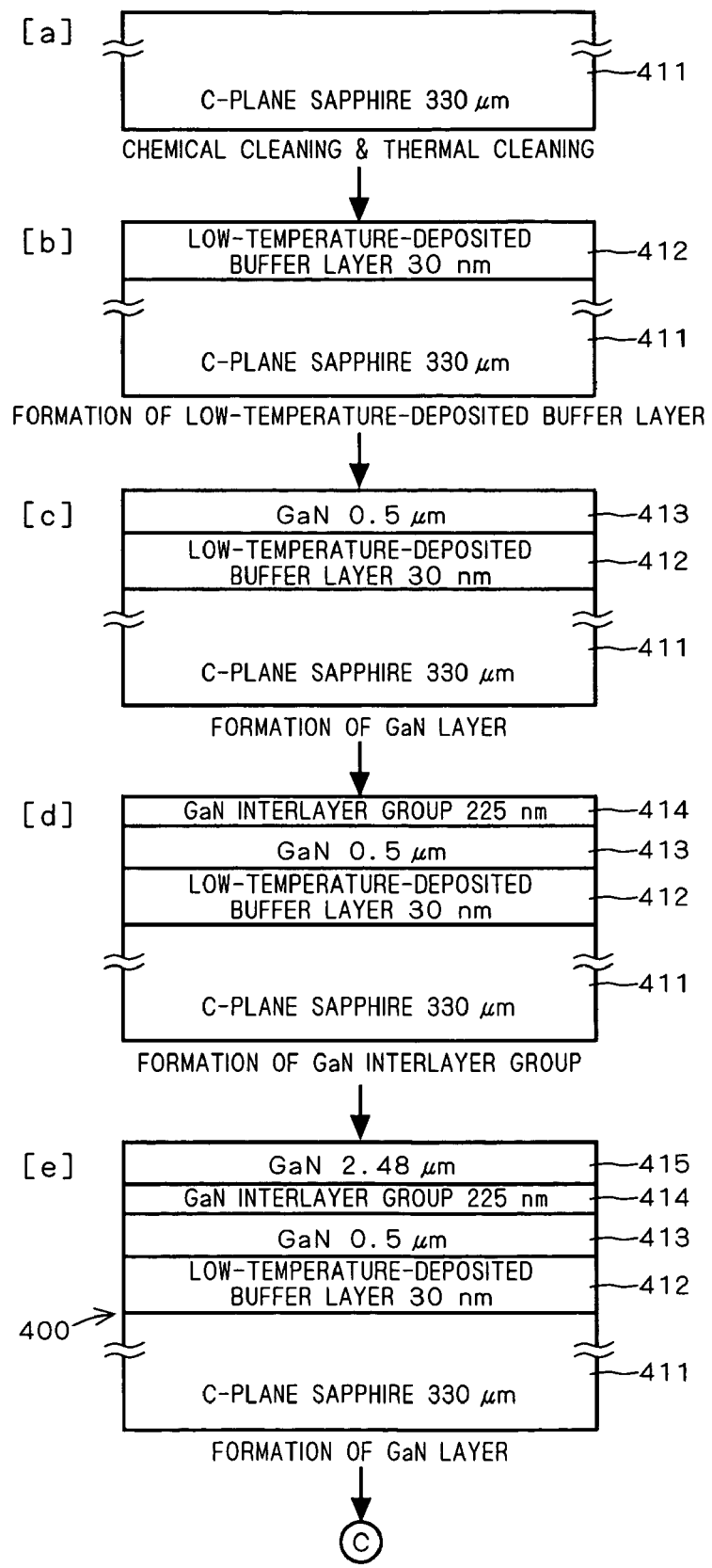
FIG. 11 illustrates a method for manufacturing of an epitaxial wafer 400 according to Example 7.
Figure 13:
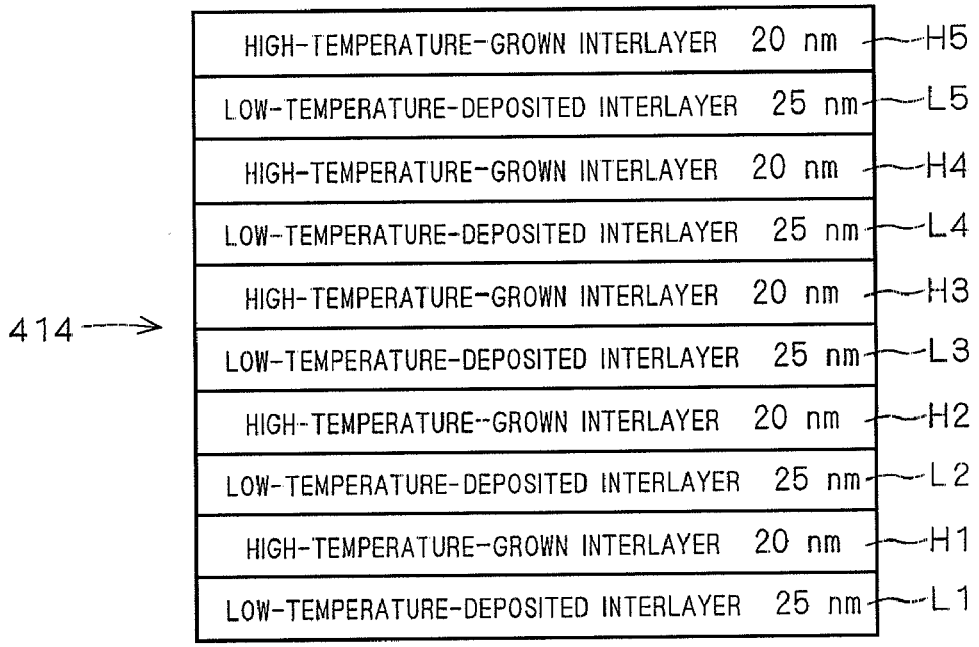
FIG. 13 illustrates a portion of a GaN intermediate layer group 414 shown in FIG. 11 in an enlarged manner.
Figure 14:
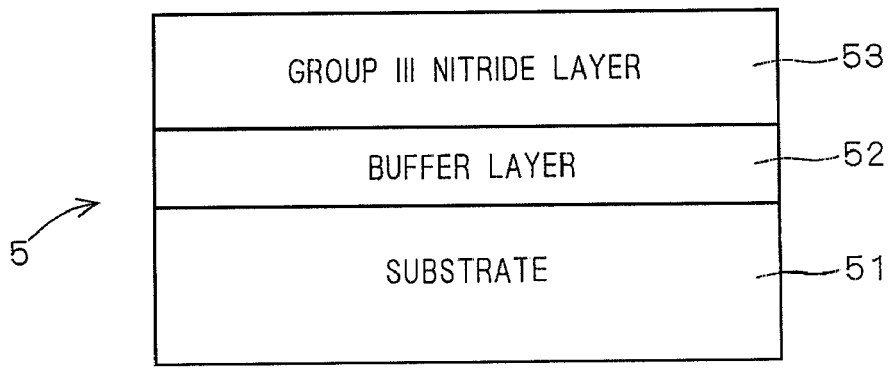
FIG. 14 is a schematic view of an epitaxial wafer 5 manufactured according to the conventional art.

A low-temperature-deposited buffer layer 412 of GaN having a thickness of 30 nm and a GaN layer 413 having a thickness of 0.5 μm were epitaxially formed on a base 411 similar to that used in Example 1 under the same conditions as those in Example 1 ([b] and [c] in FIG. 11). Then, a GaN interlayer group 414 was epitaxially formed on the GaN layer 413 ([d] in FIG. 11). The GaN interlayer group 414 was prepared by alternately stacking low-temperature interlayers each having a thickness of 20 nm, formed at a growth temperature of 500° C. lower than that for the GaN layer 413, and high-temperature-grown interlayers each having a thickness of 25 nm, formed at a growth temperature of 1180° C. FIG. 13 shows the GaN interlayer group 414 in an enlarged manner, for illustrating the stacked state. As shown in FIG. 13, five pairs of low-temperature-deposited and high-temperature-grown interlayers L1 and H1, L2 and H2, L3 and H3, L4 and H4 and L5 and H5 are stacked in the GaN interlayer group 414 according to Example 6.

A method of forming the GaN interlayer group 414 is now described. The method of forming the GaN interlayer group 414 includes two steps of:

setting the temperature of the wafer 411 to 500° C. for introducing a gas mixture of TMG and ammonia gas into the flow channel for reactive gas 31 so that the mean velocity is 2 m/sec. thereby epitaxially forming a low-temperature-deposited interlayer having a thickness of 20 nm and having low crystallinity (step A); and setting the temperature of the wafer 411 to 1180° C. for introducing a gas mixture of TMG and ammonia gas into the flow channel for reactive gas 313 so that the mean velocity is 4 m/sec. thereby epitaxially forming a high-temperature-grown interlayer having a thickness of 25 nm and having low crystallinity (step B).

According to Example 6, steps A and B were repeated five times thereby epitaxially forming the GaN interlayer group 414.

After formation of the GaN interlayer group 414, a GaN layer 415 having a thickness of 2.48 μm, an epitaxial layer 416 having a thickness of 7 nm and having a composition of $Al_{0.25}Ga_{0.75}N$, another epitaxial layer 417 having a thickness of 15 nm and having a basic composition of $Al_{0.25}Ga_{0.75}N$ doped with Si, and still another epitaxial layer 418 having a thickness of 3 nm and having a composition of $Al_{0.25}Ga_{0.75}N$ were formed under the same conditions as those in Example 1 ([c] in FIG. 11 to [e] in FIG. 12).

A sample S4 prepared in the aforementioned manner was removed from the reaction vessel 21 and the bowing value BW was measured to be 10 μm by using the same measuring method as that in Example 1.

Comparison of the Examples and the Comparative Examples

The present invention is now described with reference to a comparison of Examples 1 to 6 and Comparative Examples 1 and 2.

As clearly shown in FIG. 9, it was possible to suppress the bowing of each sample by introducing the GaN interlayer. A remarkable effect of suppressing the bowing was attained when the thickness of the interlayer was in a range of at least 10 nm to not more than 70 nm, and particularly in a range of at least 15 nm to not more than 50 nm. On the other hand, when an AlN interlayer was inserted in place of each GaN interlayer, however, the bowing value BW of each sample increased. Thus, the inserted interlayer desirably consists of GaN without Al, and the thickness of the GaN interlayer is desirably in a range of at least 10 nm to not more than 70 nm, and particularly in a range of at least 15 nm to not more than 50 nm. It is presumed that the state of bowing is deteriorated due to the large difference of the lattice constants or the thermal expansion coefficients between AlN and GaN, when the interlayer is made of AlN.

As shown in FIG. 10, the bowing value BW increased as the growth temperature increased. Therefore, the growth temperature is preferably lower than that of an adjacent GaN layer, more specifically in a range of at least 350° C. to not more than 1000° C. More preferably, the growth temperature is at least 400° C. and not more than 650° C.

Modifications

While the present invention has been described with reference to the embodiment, the present invention is not restricted to the specific mode of the aforementioned embodiment but can be modified in various ways in the range of the invention according to claims.

For example, each GaN layer may consist of a mixed crystal of AlN, GaN and InN expressed in a general formula $(Al_xGa_yIn_z)N$ ($0 \leq x \leq 1$, $0 \leq y \leq 1$, $0 \leq z \leq 1$, $x+y+z=1$). More generally stated, the GaN layer may consist of a group III-nitride. It is allowed to introduce various side components into this group III-nitride. For example, the group III-nitride may contain prescribed quantities of Si, Mg, B, Ge, Zn, Be etc., to be provided with semiconductivity. Further, contaminations that are unavoidably mixed in manufacturing steps are allowed in a range that does not essentially change the layer characteristics.

Similarly, each GaN interlayer or the GaN interlayer group does not simply substantially contain Al except as a quantity unavoidably mixed as contaminations. For example, each GaN interlayer may consist of a mixed crystal of GaN and InN expressed in a general formula $(Ga_xIn_y)N$ ($0 \leq x \leq 1$, $0 \leq y \leq 1$, $x+y=1$) (or a crystal of GaN). More generally stated, each GaN layer may consist of a group III-nitride which is essentially without Al. It is not necessarily required that the composition of each GaN interlayer or the GaN interlayer group is identical to that of each GaN layer, as a matter of course.

In Example 6, the GaN interlayer group 414 may include a third layer different from the high-temperature-grown and low-temperature-deposited interlayers H1 to H5 and L1 to L5. While the thicknesses of each low-temperature-deposited interlayer and each high-temperature-grown interlayer were set to 20 nm and 25 nm, respectively, in Example 6, the thicknesses are not so restricted. More specifically, an equivalent bowing suppressing effect can be attained also by setting the thicknesses of each low-temperature-deposited interlayer and each high-temperature-grown interlayer to at least 15 nm and not more than 50 nm, and at least 10 nm and not more than 100 nm, respectively. Further, an equivalent bowing suppressing effect can also be attained by setting the growth temperatures for the low-temperature-deposited and high-temperature-grown interlayers L1 to L5 and H1 to H5 to at least 350° C. and not more than 1000° C. and to at least 800° C. and not more than 1300° C., respectively. The growth temperature for the high-temperature-grown interlayers H1 to H5 must be higher than that of the low-temperature-deposited interlayers L1 to L5. More preferably, the growth temperatures of the low-temperature-deposited interlayers L1 to L5 and the high-temperature-grown interlayers H1 to H5 are set to at least 400° C. and not more than 650° C. and to at least 1000° C., respectively.

While the present invention has been shown and described in detail, the foregoing description is in all aspects illustrative and not restrictive. It is therefore understood that numerous modifications and variations can be devised without departing from the scope of the invention.

What is claimed is:

1. An epitaxial wafer comprising:
   a) a substrate;
   b) at least two group III-nitride layers epitaxially formed on said substrate; and
   c) at least one group III-nitride interlayer epitaxially formed between said at least two group III-nitride layers and which substantially does not contain Al, said at least one group III-nitride interlayer comprising
      c-1) at least one first interlayer formed at a first growth temperature, and
      c-2) a plurality of second interlayers alternately stacked with said at least one first interlayer and formed at a second growth temperature that is lower than said first growth temperature and also lower than a growth temperature of each of said at least two group III-nitride layers.

2. The epitaxial wafer according to claim 1, wherein said at least two group III-nitride layers have a first composition and said at least one first interlayer and said second interlayers have a second composition that is different from said first composition, and wherein said at least one group III-nitride interlayer includes at least two pairs of layers each consisting of one said first interlayer and one said second interlayer.

3. The epitaxial wafer according to claim 1, wherein a thickness of said at least one first interlayer is at least 10 nm and not more than 100 nm, and a thickness of said second interlayers is at least 15 nm and not more than 50 nm.

4. The epitaxial wafer according to claim 1, wherein said first growth temperature is at least 800° C. and not more than 1300° C., and said second growth temperature is at least 350° C. and not more than 1000° C.

5. An epitaxial wafer comprising:
   a) a substrate;
   b) at least two group III-nitride layers epitaxially formed on said wafer; and
   c) at least one group III-nitride interlayer epitaxially formed between said at least two group III-nitride layers and which substantially does not contain Al, said at least one group III-nitride interlayer comprising c-1) at least one first interlayer, and
c-2) a plurality of a second interlayers formed at a growth temperature that is different from that of said first interlayer and which are alternately stacked with said at least one first interlayer;

wherein said at least one group III-nitride interlayer group functions as a stress relaxation layer.

* * * * *